(12) United States Patent
Jou et al.

(10) Patent No.: US 8,664,729 B2
(45) Date of Patent: Mar. 4, 2014

(54) METHODS AND APPARATUS FOR REDUCED GATE RESISTANCE FINFET

(75) Inventors: Chewn-Pu Jou, Hsin-Chu (TW); Tzu-Jin Yeh, Hsin-Chu (TW); Hsieh-Hung Hsieh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 13/325,922

(22) Filed: Dec. 14, 2011

(65) Prior Publication Data
US 2013/0154011 A1   Jun. 20, 2013

(51) Int. Cl.
H01L 27/088 (2006.01)

(52) U.S. Cl.
USPC .......................... 257/401; 257/368

(58) Field of Classification Search
USPC ................... 257/368, 401
See application file for complete search history.

(56) References Cited

U.S. PATENT DOCUMENTS

| | | | | |
|---|---|---|---|---|
| 5,403,436 | A * | 4/1995 | Fujimura et al. | 216/69 |
| 5,946,542 | A * | 8/1999 | Iyer | 438/7 |
| 6,255,230 | B1 * | 7/2001 | Ikakura et al. | 438/765 |
| 6,372,670 | B1 * | 4/2002 | Maeda | 438/787 |
| 6,849,505 | B2 * | 2/2005 | Lee et al. | 438/261 |
| 7,001,855 | B2 * | 2/2006 | Ohmi et al. | 438/792 |
| 7,355,253 | B2 | 4/2008 | Cohen | |
| 7,361,958 | B2 | 4/2008 | Brask et al. | |
| 2001/0012699 | A1 * | 8/2001 | Maeda | 438/789 |
| 2001/0017402 | A1 * | 8/2001 | Usami | 257/642 |
| 2001/0029109 | A1 * | 10/2001 | Maeda et al. | 438/778 |
| 2003/0124873 | A1 * | 7/2003 | Xing et al. | 438/770 |
| 2003/0148629 | A1 * | 8/2003 | Ohmi et al. | 438/778 |
| 2005/0136576 | A1 * | 6/2005 | Ishihara et al. | 438/162 |
| 2006/0121744 | A1 * | 6/2006 | Quevedo-Lopez et al. | 438/785 |
| 2006/0205155 | A1 * | 9/2006 | Makabe et al. | 438/257 |
| 2008/0251849 | A1 | 10/2008 | Yamagami et al. | |
| 2008/0305647 | A1 * | 12/2008 | Matsushita et al. | 438/791 |
| 2008/0318442 | A1 * | 12/2008 | Ogawa et al. | 438/785 |

FOREIGN PATENT DOCUMENTS

JP    2005072582    3/2005

OTHER PUBLICATIONS

Borremans, J., et al. "Perspective of RF design in future planar and FinFET CMOS," RMO1D-1, 2008 IEEE Radio Frequency Integrated Circuits Symposium, pp. 75-78.
Šiprak, D., et al., "FinFET RF Receiver Building Blocks Operating Above 10 GHz," Proceedings of the European Solid State Device Research Conference, 2009, 4 pages.

* cited by examiner

Primary Examiner — Yu-Hsi D Sun
Assistant Examiner — Grant Withers
(74) Attorney, Agent, or Firm — Slater & Matsil, L.L.P.

(57) ABSTRACT

Methods and apparatus for reduced gate resistance finFET. A metal gate transistor structure is disclosed including a plurality of semiconductor fins formed over a semiconductor substrate, the fins being arranged in parallel and spaced apart; a metal containing gate electrode formed over the semiconductor substrate and overlying a channel gate region of each of the semiconductor fins, and extending over the semiconductor substrate between the semiconductor fins; an interlevel dielectric layer overlying the gate electrode and the semiconductor substrate; and a plurality of contacts disposed in the interlevel dielectric layer and extending through the interlevel dielectric layer to the gate electrode; a low resistance metal strap formed over the interlevel dielectric layer and coupled to the gate electrode by the plurality of contacts; wherein the plurality of contacts are spaced apart from the channel gate regions of the semiconductor fins. Methods for forming the reduced gate finFET are disclosed.

16 Claims, 10 Drawing Sheets

METHODS AND APPARATUS FOR REDUCED GATE RESISTANCE FINFET

BACKGROUND

As devices manufactured in semiconductor processes continue to shrink, certain characteristics of the smaller devices are less than optimal for certain types of applications. In particular, high frequency or radio frequency circuits, such as low noise amplifiers (LNAs) have demanding requirements on transistors. As devices sizes continue to shrink, the transistors of the advanced semiconductor processes exhibit increased leakage as the gate oxides become thinner, also short-channel effects may reduce performance of planar devices in advanced processes.

One area that promises improvement in transistor performance at deep submicron process nodes is the use of metal gates. Replacing conventional polysilicon gates with metal gates in MOS transistors can provide several advantages. Use of metal gates to replace the polysilicon gates can increase performance by increasing the gate field effect. Combining the metal gates with high-k gate dielectrics can improve transistor performance still further. The drive current can be increased, the source-drain leakage may be decreased, and the use of a thicker dielectric layer can also reduce gate leakage.

However, the resistance of the metal gate in such devices increases over the prior poly gates. Increased gate resistance has a negative impact in several areas. For example, the maximum oscillation frequency for a device is inversely proportional to the gate resistance Rg. Further, the noise factor for the device is directly proportional to the gate resistance. Thus, as the gate resistance increases, the noise factor increases, which is undesirable, while the maximum frequency decreases, which is also undesirable.

Known approaches to reduce metal gate resistance in conventional MOS FET transistors include providing a low resistance strap over the metal gate. For example a metal-1 strap can be formed over the gate material. Multiple contacts may be used to couple the low resistance metal strap to the metal gate. However, known semiconductor process approaches for this structure can create defects such as etch damage in the metal gate. For the transistor, the use of the contacts over the active area can result in threshold voltage ("Vt") variance that is negatively impacts the device performance, which is undesirable.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed concepts of the application, and do not limit the scope of the disclosure and do not limit the scope of the appended claims.

Embodiments of the present application, examples of which are now described in detail, provide novel methods and apparatus for reduced gate resistance in metal gate devices. FinFET transistors are used with the metal gate and high-k dielectric. Multiple fin finFETs provide an opportunity to reduce the gate resistance using a plurality of contacts and a low resistance metal strap, while making contacts to the metal gate outside of the active areas of the finFET devices. In this manner, the problems observed with prior approaches are eliminated, while a low resistance metal gate transistor is provided. The embodiments do not require substantial changes to the processes, or additional processing steps and are compatible with existing semiconductor processes. Use of the embodiments can greatly reduce the gate resistance for a device, lowering the noise factor and increasing the maximum operating frequency for the device. The transistors formed using the embodiments are particularly useful for radio frequency and high frequency applications, such as low noise amplifiers in RF circuits.

Figure 1:
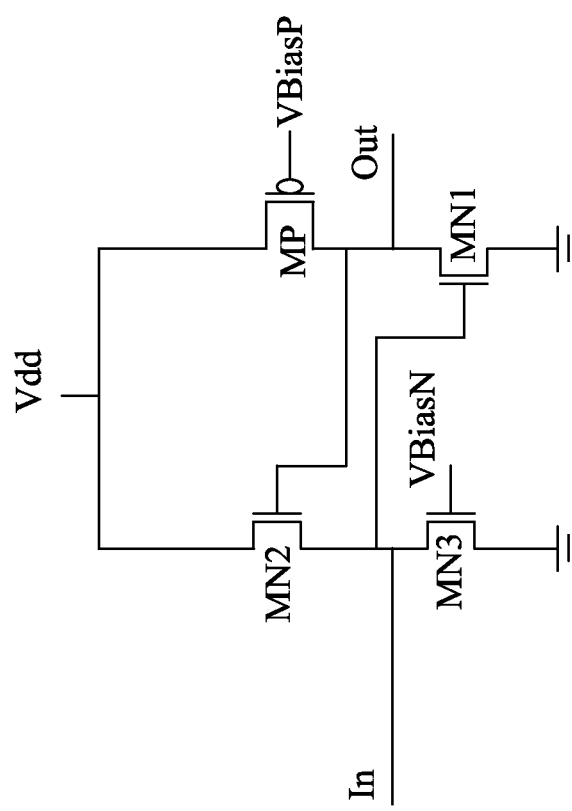
FIG. 1 depicts in a simplified circuit schematic an amplifier circuit for use with the embodiments.

FIG. 1 depicts in a simple circuit diagram a low noise amplifier 10 for use with the embodiments. In FIG. 1, the amplifier receives an input on node In and outputs a signal on node Out. Transistors MP and MN3 bias the circuit, while transistor MN2 provides a feedback path from the output back to the input. Transistor MN1 drives the output in response to receiving the input at node In.

Figure 2:
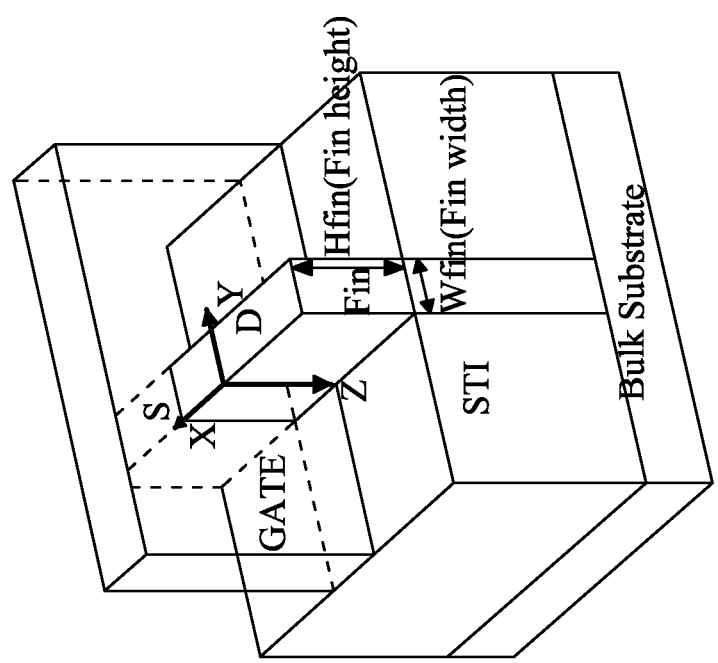
FIG. 2 depicts in a three dimensional projection a bulk finFET device for use with the embodiments.

FIG. 2 depicts in a three dimensional projection view a finFET transistor structure 20 for use with the embodiments. A substrate such as a semiconductor substrate is provided, labeled "Bulk Substrate" which may be a silicon or germanium substrate, for example, and is patterned to form a semiconductor fin labeled "Fin". The fin extends vertically above the surface of the bulk substrate. A dielectric or insulator layer labeled "STI" (for "shallow trench isolation") extends over the top surface of the bulk substrate. The fin extends above the STI and has a height "Hfin" and width "Wfin" in the exposed portion. The active area for the finFET transistor will be formed at the surface of the three sides of the fin, that is, the gate width W for the transistor will be the sum of the height "Hfin" twice, and the width "Wfin". Thus, the device 20 of FIG. 2 is a "triple gate" finFET device. Alternatively, some finFET devices known as "double gate" devices may only form active areas on the vertical portions of the fin. The use of the finFET allows a longer gate width W in a given silicon area when compared to planar devices, as the gate width is increased by the three dimensional area of the fin, without increasing the silicon area. Further the transistor gate length L (which extends into the page in the view of FIG. 2) can still scale down with the semiconductor process scaling, without a corresponding reduction in gate width, increasing the W/L ratio for the transistor. Thus, the use of finFET devices has advantages that increase over planar transistors with advances in semiconductor processing.

In FIG. 2, a gate electrode labeled "Gate" is formed over the fin "Fin" and the surface of the STI over the bulk substrate. In FIG. 2 the gate electrode has a planar top surface, such as may be obtained when a gate electrode is formed by a CMP process following an electroplating step. Alternatively the gate electrode could be formed by a conformal deposition, and in that case, the top surface of the gate electrode "Gate" would not be planar but would track the fin sides and top and then align with the substrate surface.

In order to form a FET transistor using the fin, source and drain regions are formed in the fin using, for example, ion implantation steps to introduce dopant ions into the regions labeled "S" for source and "D" for drain. P-type and n-type finFET devices may be formed and used as PMOS and NMOS transistors. Since a semiconductor substrate is typically doped to one dopant type, for example p-type, doped well regions may be used to form the complementary dopant type, such as N-wells, and the fins may be formed over the wells. For a p-type transistor, which has p-type source and drain regions, an N-well may be created in the substrate and fins formed over the N-well. Also, although not visible in the figure, a gate dielectric is formed between the surface of the fin "Fin" and the gate electrode "Gate" to complete the transistor formation.

Figure 3:
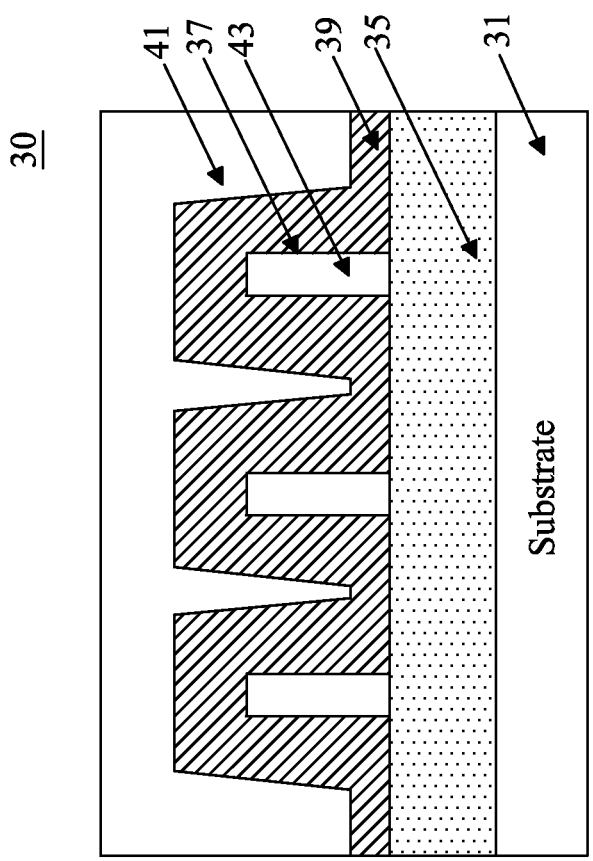
FIG. 3 depicts in a cross sectional view a silicon-on-insulator multiple fin finFET device for use with the embodiments.

In an alternative structure for use with the embodiments, FIG. 3 depicts in a cross-sectional view a silicon-on-insulator or "SOI" embodiment finFET transistor 30. Substrate 31 which may be a semiconductor substrate or other substrate including as non-limiting examples silicon, germanium, and the like, is shown with a field oxide or other insulator, such as STI, 35, deposited over it. Epitaxially grown fins 43 are shown formed on the surface of the insulator 35. The gate dielectric 37, gate 39, and interlevel dielectric 41 are formed over the exposed sides and tops of the fins 43. Either the bulk substrate approach of FIG. 2 or the SOI approach of FIG. 3 may be used with the embodiments. In FIG. 3, the gate electrode 39 is conformally deposited over each of the fins 43. A gate dielectric 37, which may be a high-K gate dielectric, is formed over the fins beneath the gate electrode. In the embodiments, the gate electrode is a metal gate, for example containing aluminum or tantalum, and may be formed by a replacement gate process or otherwise. The interlevel dielectric 41 may be an oxide, nitride, silicon oxynitride; carbons containing dielectric or other dielectrics such as are used for interlevel isolation in semiconductor processes.

Figure 4:
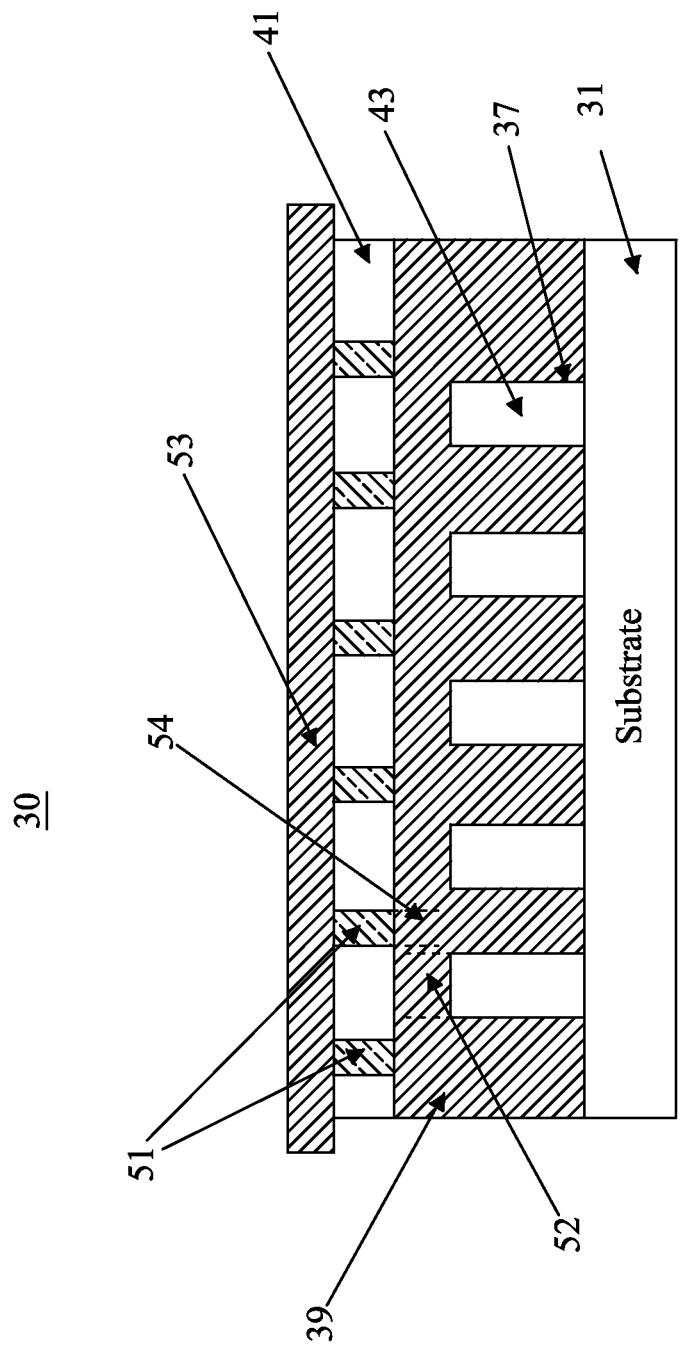
FIG. 4 depicts in a cross-sectional view a multiple fin finFET structure embodiment.

FIG. 4 depicts in a cross section a multiple fin finFET embodiment 40. In FIG. 4, the fins 43 are formed in a bulk substrate approach on substrate 31. The fins have portions that are covered by the gate dielectric 37 forming an active area on two vertical sides and across the top of each fin. A common gate electrode 39 extends across and over each of the fins 43. In the embodiments, the gate electrode 39 and gate dielectric 37 form a high-K metal gate structure. The gate electrode 39 is a metal gate and may contain, for example, aluminum, tantalum, tungsten, molybdenum, titanium and other metals and may be produced by a replacement gate process, or by using a fully silicided process (siliciding an entire gate structure with a metal silicide). The gate dielectric 37 may be a high K gate dielectric suitable for use with a metal gate, including dielectrics with a dielectric constant K of greater than 3.8 (the dielectric constant of silicon oxide) and preferably greater than about 10. Dielectrics that contain hafnium, for example, may be used. Other examples include a hafnium containing oxide layer, a tantalum containing oxide layer, an aluminum containing oxide layer, any high K dielectric material, including without limitations where the dielectric constant K is greater than 10. In addition the gate dielectric may also be one of Ta2O5, Al2O3, PEOX, TEOS, or a combination of any of these dielectrics.

In FIG. 4, the gate electrode 39 has a planar top surface such as is obtained using a chemical mechanical polishing ("CMP") process. As described above, the resistance of the metal gate material is higher than prior gate materials. While the use of the metal gate material in advanced semiconductor processes does have certain advantages, the increased gate resistance is a disadvantage, particularly when the resulting transistors are used in high frequency and radio frequency applications.

One metric that is important to consider is the thermal noise factor. The noise factor "F" is given by:

$$F = 1 + \frac{R_g}{R_s} + \frac{\left(\frac{\gamma}{\alpha}\right)g_m}{R_s}\left(\frac{\omega}{\omega_T}\right)^2 (R_s + R_g)^2 \quad \text{Equation 1}$$

In Equation 1, the gate resistance Rg is seen in the numerator of several of the factors, and the thermal noise is proportional to the gate resistance Rg. An increased gate resistance therefore has the undesirable effect of increasing the thermal noise.

Further, an important metric for high frequency devices is the maximum oscillation frequency, which is given by (note: fT is the cutoff frequency):

$$f_{max} = \frac{fT}{2\sqrt{g_{ds}(R_g + R_s) + 2\pi \cdot fT \cdot R_g C_{gd}}} \quad \text{Equation 2}$$

So as seen in Equation 2, the maximum frequency is reduced with increasing gate resistance Rg. This means that unless the gate resistance Rg is reduced from the prior metal gate approaches, metal gate devices are not appropriate for some high frequency applications.

In FIG. 4, the gate resistance of the metal gate is reduced by use of contacts 51 to couple that gate electrode 39 to a lower resistance metal strap, such as a metal-1 layer strap 53. The structure is arranged in a particular way. Contacts 51 are formed in the interlevel dielectric ("ILD") layer 51 which overlies the gate electrode 39. The contacts 51 are conductors that are formed in openings in the ILD layer, and form a vertical conductive connection to the metal-1 strap 53. Multiple contacts are used, the number shown is only for illustration, for example in an actual device 30, 40 or more may be used. Additional metal-1 straps and additional gate electrodes may be formed in parallel to the ones shown, of course these are not visible in the cross section of FIG. 4, but these will further reduce the gate resistance.

The contacts 51 are formed over non-channel gate areas 54 and are spaced from channel gate areas such as region 52 for the finFET devices. In this manner the etch damage to the gate electrode and the Vt variances that were seen in prior approaches are eliminated. Using the finFET metal gate devices and using the contact placement of the embodiments thus provides a lowered gate resistance in a metal gate device, without changes to the semiconductor processing and without additional process steps.

Note that in FIG. 4 the fins 43 and the gate electrode 39 form a multiple fin finFET device. This is accomplished by coupling source and drain doped regions in the fins, not visible in this cross section, to one another. The number of fins can vary but may be as few as 3, up to 10 or even 20 depending on the current drive and transistor area needed for a particular application. Use of the finFET transistors in amplifiers and drivers may require large gain and substantial drive currents. These requirements may be satisfied by adding additional fins (increased source and drain area) and using metal gates coupled in parallel. Each of the gates used in the embodiments has contacts to one or more metal straps, which lower the gate resistance. The straps may be a single metal piece or parallel strips, depending on the particular layout and available space. The metal straps maybe metal-1 or another low resistance conductor.

Figure 5:
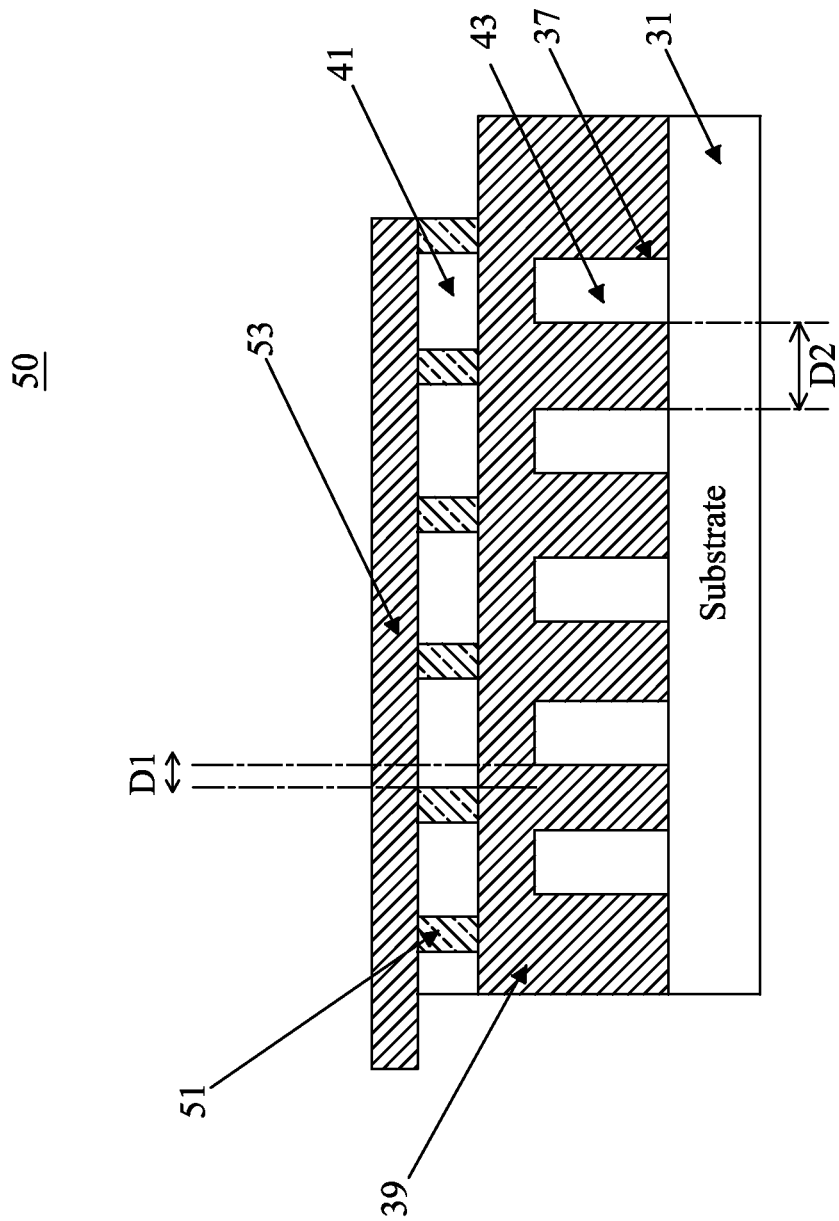
FIG. 5 depicts in a cross-sectional view an alternative embodiment multiple fin finFET structure.

The embodiment of FIG. 4 is a double ended metal 1 structure. In FIG. 5, an alternative embodiment 50 is shown in cross section with a single ended metal 1 structure. The reference numerals for common elements from FIG. 4 are the same in FIG. 5. The metal 1 strap 53 now is extended only at one end which forms a connection to the structure 50. The substrate, gate electrode, fins, ILD layer, contacts are arranged generally as in FIG. 4. FIG. 5 is also used to illustrate a spacing feature of the embodiments. The distance D2 illustrates a fin to fin spacing. The area between the fins provides the non-channel gate area for the embodiments. This area is a feature of a multiple fin finFET structure that allows for making the contact areas away from channel gate area. The spacing D1 illustrates a spacing between the edge of the contact 51 closest to the fin 43 and the active area of the fin. This spacing D1 may have a minimum requirement in the design rules for a particular semiconductor process. In an example process, this spacing was between 8-12 nanometers, while the contact area ranged from 26×26 nanometers squared to 36×36 nanometers squared. However the minimum spacing, the actual sizes of the contacts, the width of the fins, and the width of the gate and metal-1 straps are all variable and may change with the requirements of a particular design and the design rules of a particular semiconductor process. Note that these and other variations are contemplated as additional embodiments that fall within the scope of the appended claims. In the embodiments, the contacts are placed spaced from the active channel gate areas and are formed over non-channel gate areas, and the contacts couple a lower resistance metal to the gate electrode to reduce the gate resistance for the metal gate finFET transistor.

Figure 6:
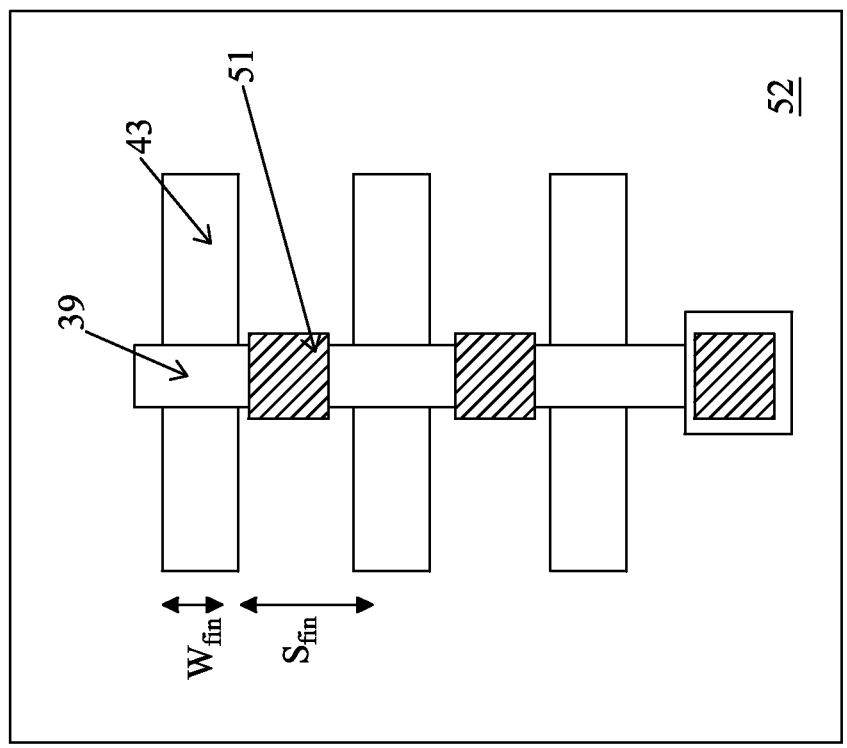
FIG. 6 depicts in a top view an embodiment structure.

FIG. 6 illustrates, in a top view, a multiple fin finFET structure 60 having a single ended gate electrode 39. In FIG. 6, common elements are depicted and again common numerals are used for the elements shown in FIGS. 4 and 5, for example. Fins 43 are depicted arranged in parallel and spaced apart by a spacing Sfin, and having a width Wfin for each fin. Contacts 51 are formed over the gate electrode 39 which lies over each of the fins 43 and forms an active area with each of the fins. Region 52 may be, for example, a portion of a semiconductor substrate or a well region within a semiconductor substrate, such as a P-well or N-well region. Again contacts 51 lie over the gate electrode 53 in places apart from the active channel regions. Note that while the gate 39 is depicted here as perpendicular to the fin direction, it need not be exactly so, and can run diagonally or even in a nonlinear fashion as long as the contacts are spaced from the channel region. These alternate arrangements form additional embodiments.

Figure 7:
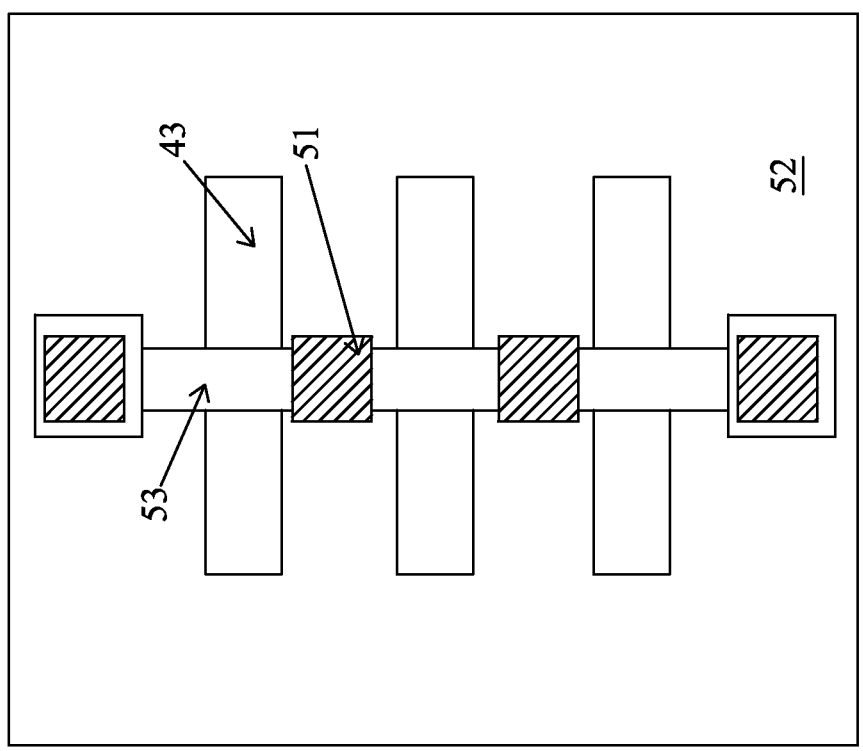
FIG. 7 depicts in a top view another embodiment structure.

FIG. 7 illustrates an alternative embodiment in a top view depicting a double ended gate electrode 39 for the structure, such as in FIG. 4. Contacts 51 are provided at each end of the gate electrode 39, and the gate electrode can be strapped to the overlying metal-1 or other metal layer strap at each end.

In both the embodiments of FIGS. 6, and 7, the fins 43 also have source and drain regions (not shown) formed outside and adjacent to the gate intersections and the fins and the gate form FET transistors. The source and drain regions would be coupled together to form a multiple fin finFET. Additional gate regions may also be provided, and if provided, would also have contacts 51 for coupling to a metal strap region.

Figure 8:
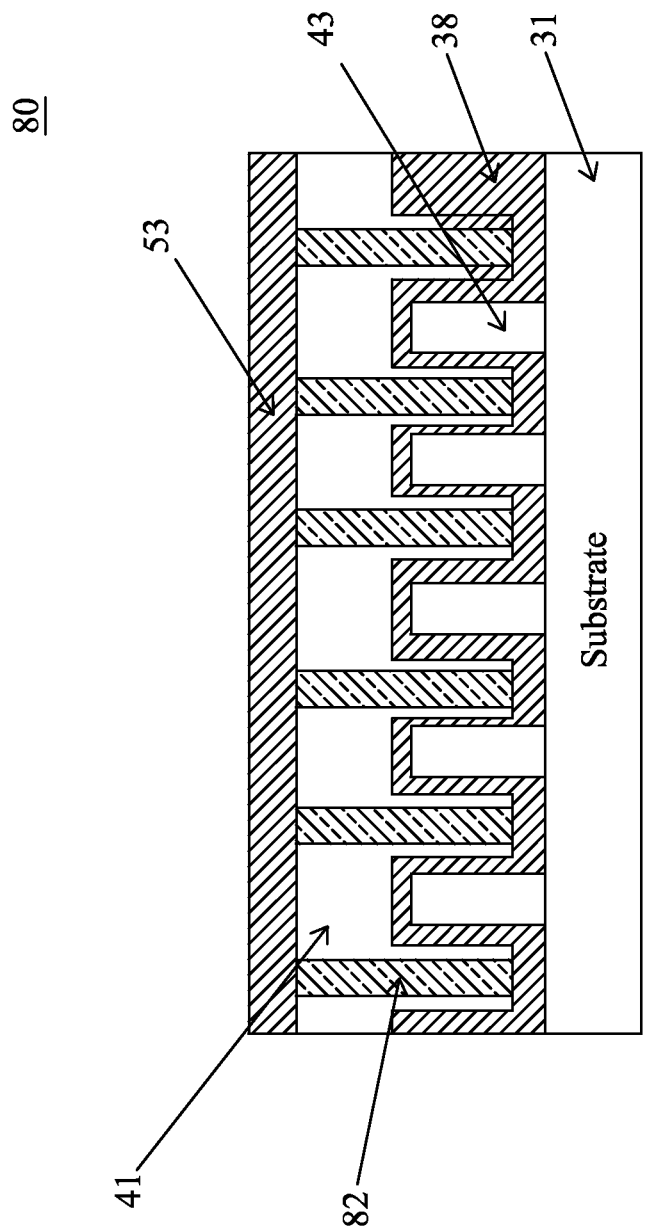
FIG. 8 depicts in a cross-sectional view another embodiment structure.

FIG. 8 depicts in a cross sectional view an embodiment structure of a multiple fin finFET that has an alternative gate electrode, now conformal gate electrode 38. Common elements are again given common reference numerals and each of the elements of the substrate, fins, ILD layer, and metal strap are given the same numerals as in FIG. 8. Gate electrode 38 is now formed using conformal deposition, and it follows the contours of the fins 43 and the substrate 31 between the fins. Contacts 82 now extend from the top of the ILD layer 41 to the gate electrode 38 in the non-channel gate areas, which means these contacts 82 are much longer than the contacts of the other embodiments described above. The multiple fins 43 again are coupled together to form a single finFET device and include source and drain regions that are not shown in this figure. The contacts 82 are spaced apart from the channel gate areas of the fins 43 by a minimum spacing distance. The operation of the structure 80 is the same as the prior embodiments; only the gate electrode formation, and the contact formation, is different. The structure of FIG. 8 may be single ended, or double ended, as described above. Again the structure reduces the gate resistance for the metal gate of the high-K metal gate structure.

In typical applications, the number of fins can vary but may be about 10 or greater. For a typical device, calculations that compare the reduced gate resistance to a similar metal gate structure formed without the use of the embodiments indicate that use of the embodiments results in a reduction of the gate resistance of between about 50% and 97%, with the highest reduction measured for a greater number of fins, and for the single ended embodiments. The same calculation was also done for different sheet resistances for the metal gate electrode, the reduction of the gate resistance using the embodiments ranged from about 82% to about 97%, the higher results were for a single ended embodiment using a sheet resistance of about 100 Ohms/square. So the biggest reductions were achieved when high sheet resistance metal gates were used with the embodiments.

The embodiment transistor structures using the multiple fin finFETs may be used in a wide variety of devices. As indicated above, the use of the embodiments is particularly applicable to applications where frequency is higher, such as radio frequency (RF) and high frequency circuits. Oscillators, low noise amplifiers, radio receivers/transmitters and like circuits may be implemented using the high-K metal gate devices of the embodiments.

Figure 9:
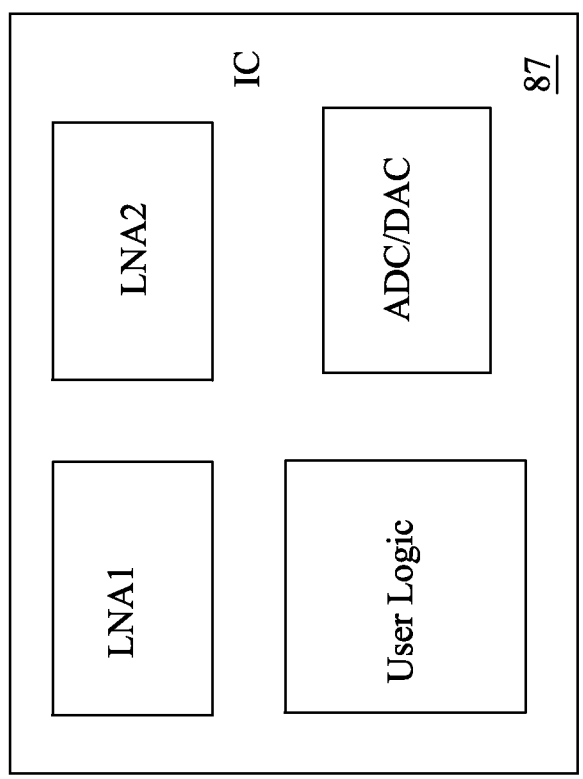
FIG. 9 depicts in a block diagram an integrated circuit incorporating the embodiments.

FIG. 9 depicts in a simple block diagram an example integrated circuit IC 87 that includes, for illustration, two low noise amplifiers LNA1 and LNA2, user logic, and a data converter such as an analog to digital converter or a digital to analog converter (ADC/DAC). The low gate resistance metal gate finFET structure described above may be used to implement the transistors in one or more of these functions in the integrated circuit, thereby improving the performance obtained.

Figure 10:
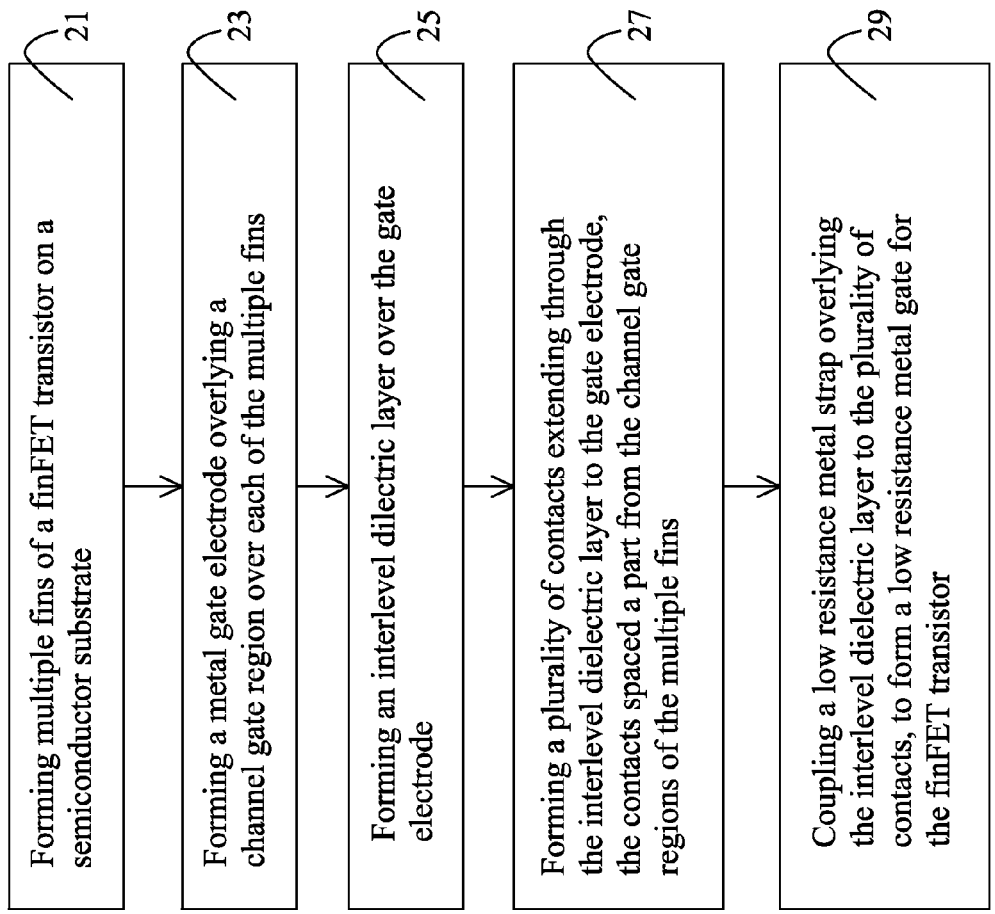
FIG. 10 depicts in a flow diagram a method embodiment.

FIG. 10 illustrates in a flow diagram a method embodiment. In step 21, multiple fins of a finFET transistor are formed on a semiconductor substrate. In step 23, a metal gate electrode is formed overlying a channel gate region of each of the multiple fins. In step 25, an interlevel dielectric layer is formed over the gate electrode. In step 27 a plurality of contacts are formed extending through the interlevel dielectric to the gate electrode, the contacts spaced apart from the channel gate region of the fins. At step 29, the contacts are coupled to a low resistance metal strap overlying the interlevel dielectric layer to form a low resistance metal gate finFET transistor.

In an example embodiment, a metal gate transistor structure is provided including a plurality of semiconductor fins formed over a semiconductor substrate, the fins being arranged in parallel and spaced apart; a metal containing gate electrode formed over the semiconductor substrate and overlying a channel gate region of each of the semiconductor fins, and extending over the semiconductor substrate between the semiconductor fins; an interlevel dielectric layer overlying the gate electrode and the semiconductor substrate; a plurality of contacts disposed in the interlevel dielectric layer and extending through the interlevel dielectric layer to the gate electrode; a low resistance metal strap formed over the interlevel dielectric layer and coupled to the gate electrode by the plurality of contacts; and wherein the plurality of contacts are spaced apart from the channel gate regions of the semiconductor fins. In a further additional embodiment, a high-K gate dielectric is disposed between the gate electrode and the semiconductor fins.

In still a further embodiment, the metal gate transistor structure includes the gate dielectric that has a dielectric constant of greater than about 10. In yet another embodiment, the metal gate transistor structure is provided wherein the gate dielectric is one of nitrogen containing oxide layer, a hafnium containing oxide layer, a tantalum containing oxide layer, and an aluminum containing oxide layer.

In still further embodiments, the metal gate transistor structure includes source and drain regions formed adjacent the channel gate regions for each of the plurality of semiconductor fins and these regions are further coupled together to form a single finFET transistor.

In another embodiment, in the metal gate transistor structure, wherein the gate electrode includes a metal from the group of aluminum, tantalum, tungsten, molybdenum, and titanium.

In yet another embodiment the semiconductor fin include source and drain regions formed adjacent to the channel gate regions.

In a further embodiment, in the metal gate transistor structure the plurality of contacts are each formed over the gate electrode in an area between the semiconductor fins.

In a further embodiment, in the metal gate transistor structure the plurality of contacts are each spaced from the channel gate region of the fins by a minimum spacing distance. In yet another embodiment the minimum spacing distance is at least 8 nanometers.

In another embodiment of the metal gate transistor structure the number of semiconductor fins is greater than about 10. In still a further embodiment, the number of contacts is greater than about 20.

In another embodiment, an integrated circuit is provided including at least one circuit formed of a plurality of metal gate transistors, each further including a plurality of semiconductor fins formed over a semiconductor substrate, the semiconductor fins being arranged in parallel and spaced apart; a metal containing gate electrode formed over the semiconductor substrate and overlying a channel gate region of each of the semiconductor fins and extending over the semiconductor substrate between the semiconductor fins; an interlevel dielectric layer overlying the metal containing gate electrode and the semiconductor substrate; a plurality of contacts disposed in the interlevel dielectric layer and extending through the interlevel dielectric layer to the metal containing gate electrode; and a low resistance metal strap formed over the interlevel dielectric layer and coupled to the metal containing gate electrode by the plurality of contacts.

In a method embodiment, the method includes forming multiple semiconductor fins over a semiconductor substrate, the multiple semiconductor fins spaced apart; forming a metal containing gate electrode overlying a channel gate region of each of the semiconductor fins, and extending over the semiconductor substrate between the semiconductor fins; forming an interlevel dielectric layer overlying the metal containing gate electrode and the semiconductor substrate; forming a plurality of contacts extending through the interlevel dielectric layer to the metal containing gate electrode, each of the plurality of contacts spaced from the channel gate regions of the semiconductor fins; and forming a metal strap layer over the interlevel dielectric layer coupled to the metal containing gate electrode through the plurality of contacts.

The scope of the present application is not intended to be limited to the particular illustrative embodiments of the structures, methods and steps described in the specification. As one of ordinary skill in the art will readily appreciate from the disclosure of the example embodiments, processes, or steps, presently existing or later to be developed, that perform substantially the same function or achieve substantially the same result as the corresponding embodiments described herein may be utilized and these alternatives are contemplated as part of the embodiments. Accordingly, the appended claims are intended to include within their scope such processes or steps.

What is claimed is:

1. A metal gate transistor structure, comprising:
    a plurality of semiconductor fins formed over a semiconductor substrate, the fins being arranged in parallel and spaced apart;
    a metal containing gate electrode formed over the semiconductor substrate and overlaps a channel gate region of each of the semiconductor fins in a top view;
    an interlevel dielectric layer overlying the gate electrode and the semiconductor substrate;
    a plurality of contacts disposed in the interlevel dielectric layer and extending through the interlevel dielectric layer to the gate electrode; and
    a low resistance metal strap formed over the interlevel dielectric layer and coupled to the gate electrode by the plurality of contacts;
    wherein the plurality of contacts are spaced apart from the channel gate regions of the semiconductor fins.

2. The metal gate transistor structure of claim 1 and further comprising:
    a high-K gate dielectric disposed between the gate electrode and the semiconductor fins.

3. The metal gate transistor structure of claim 2, wherein the gate dielectric has a dielectric constant of greater than about 10.

4. The metal gate transistor structure of claim 2, wherein the gate dielectric is one selected from the group consisting essentially of a nitrogen containing oxide layer, a hafnium containing oxide layer, a tantalum containing oxide layer, or an aluminum containing oxide layer.

5. The metal gate transistor structure of claim 4, wherein source and drain regions are formed adjacent the channel gate regions for each of the plurality of semiconductor fins and are further coupled together to form a single finFET transistor.

6. The metal gate transistor structure of claim 1, wherein the gate electrode comprises a metal one selected from the group consisting essentially of aluminum, tantalum, tungsten, molybdenum, and titanium.

7. The metal gate transistor structure of claim 1, wherein the semiconductor fins further comprise source and drain regions formed adjacent to the channel gate regions.

8. The metal gate transistor structure of claim 1, wherein the plurality of contacts are each formed over the gate electrode in an area between the semiconductor fins.

9. The metal gate transistor structure of claim 1, wherein the plurality of contacts are each spaced from the channel gate region of the fins by a minimum spacing distance.

10. The metal gate transistor structure of claim 9, wherein the minimum spacing distance is at least 8 nanometers.

11. The metal gate transistor of claim 1, wherein the number of semiconductor fins is greater than about 10.

12. The metal gate transistor of claim 11, wherein the number of contacts is greater than about 20.

13. An integrated circuit comprising:
at least one circuit formed of a plurality of metal gate transistors, each further comprising:
a plurality of semiconductor fins formed over a semiconductor substrate, the semiconductor fins being arranged in parallel and spaced apart;
a metal containing gate electrode formed over the semiconductor substrate and overlaps a channel gate region of each of the semiconductor fins in a top view; and extending over the semiconductor substrate between the semiconductor fins;
an interlevel dielectric layer overlying the metal containing gate electrode and the semiconductor substrate;
a plurality of contacts disposed in the interlevel dielectric layer and extending through the interlevel dielectric layer to the metal containing gate electrode; and
a low resistance metal strap formed over the interlevel dielectric layer and coupled to the metal containing gate electrode by the plurality of contacts.

14. The integrated circuit of claim 13, wherein the metal containing gate electrode further comprises one selected from the group consisting essentially of aluminum, tantalum, tungsten, molybdenum, and titanium.

15. The integrated circuit of claim 13, and further comprising a high-K gate dielectric disposed between the metal containing gate electrode and the channel gate region of each of the semiconductor fins.

16. The integrated circuit of claim 13, wherein for each of the metal gate transistors, the plurality of contacts are each spaced from the channel gate region of the semiconductor fins by a minimum spacing distance.

\* \* \* \* \*

UNITED STATES PATENT AND TRADEMARK OFFICE
CERTIFICATE OF CORRECTION

PATENT NO.         : 8,664,729 B2                                                    Page 1 of 1
APPLICATION NO.    : 13/325922
DATED              : March 4, 2014
INVENTOR(S)        : Chewn-Pu Jou et al.

It is certified that error appears in the above-identified patent and that said Letters Patent is hereby corrected as shown below:

In the Claims,

In Col. 8, line 47, claim 1, delete "in a top view;" insert --and extending over the semiconductor substrate between the semiconductor fins;--.

Signed and Sealed this
Twenty-third Day of June, 2015

Michelle K. Lee
*Director of the United States Patent and Trademark Office*